(12) United States Patent  
Tomino

(10) Patent No.: US 6,719,149 B2
(45) Date of Patent: Apr. 13, 2004

(54) ACCOMMODATION APPARATUS FOR COMMUNICATION DEVICES

(75) Inventor: Hiroyuki Tomino, Tokyo (JP)

(73) Assignee: Allied Telesis Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/190,340

(22) Filed: Jul. 3, 2002

(65) Prior Publication Data

US 2003/0042215 A1 Mar. 6, 2003

(30) Foreign Application Priority Data

Sep. 4, 2001 (JP) .................................... 2001-266927

(51) Int. Cl.[7] .................................................. A47F 5/00
(52) U.S. Cl. ..................... 211/26; 439/540.1; 439/456; 361/727
(58) Field of Search ........................... 211/26; 361/724, 361/725, 727; 439/456, 540.1; 312/265.1, 265.4

(56) References Cited

U.S. PATENT DOCUMENTS

| | | | |
|---|---|---|---|
| 6,077,113 A | * | 6/2000 | Lecomte |
| 6,181,549 B1 | * | 1/2001 | Mills et al. ............. 361/724 X |
| D463,416 S | * | 9/2002 | Tomino et al. |
| 6,522,551 B2 | * | 2/2003 | Hsu et al. ................. 211/26 X |
| D472,242 S | * | 3/2003 | Tomino |
| 6,543,940 B2 | * | 4/2003 | Chu |
| D474,772 S | * | 5/2003 | Dequchi et al. |
| 6,574,100 B1 | * | 6/2003 | Anderson |

\* cited by examiner

Primary Examiner—Robert W. Gibson, Jr.
(74) Attorney, Agent, or Firm—Knobbe Martens Olson & Bear LLP

(57) ABSTRACT

An accommodation apparatus facilitates the attachment, exchange, operation, and wire configuration of a plurality of communication devices, such as a media converter, and a power unit. The accommodation apparatus comprises a support part fixed to an external frame, and a loading part, movable relative to the support part. The loading part removably accommodates the communication devices, and includes a first surface and a second surface, wherein the transmission medium can be connected to the communication devices through the first and second surfaces.

24 Claims, 9 Drawing Sheets

ACCOMMODATION APPARATUS FOR COMMUNICATION DEVICES

BACKGROUND OF THE INVENTION

1. Field of the Invention

The present invention relates generally to accommodation apparatuses for communication devices, and more particularly, to an accommodation apparatus for media converters.

2. Description of the Related Art

A media converter, as used herein, refers to a device configured to convert a signal propagating through a first transmission medium to a signal for propagation through a second transmission medium, different from the first transmission medium. The transmission media can include, for example, an Unshielded Twisted Pair ("UTP") cable, and an optical fiber cable (single mode or multimode), where an electrical signal from the UTP cable is converted by the media converter to an optical signal for propagation in the optical fiber cable.

The low level network arbitration protocol used on the Ethernet is referred to as CSMA/CD (Carrier Sense Multiple Access with Collision Detection). CSMA/CD is typically used as the Media Access Control (MAC) technology for a Local Area Network (LAN). Using CSMA/CD, a communication node attempting to transmit data listens for data transmission by other nodes, and waits to begin transmission of its own data until confirming there is no transmission by other nodes in the communication system. A high-speed LAN transmitting base band signals at a transmission speed of 100 Mbps is called the 100BASE standard, which includes the 100BASE-TX and 100BASE-FX. The 100BASE-TX uses a UTP cable as a transmission medium, while 100BASE-FX uses an optical fiber cable as a transmission medium.

Media converters inexpensively provide not only a LAN Ethernet with signal transmissions using an optical fiber cable of several kilometers, but also FTTH (Fiber To The Home). In addition, the rapid development of optical fiber cables and LANs/WANs (Wide Area Networks) has demanded use of scores of media converters.

Media converter racks typically house a plurality of media converters, wherein each converter has, for example, 100BASE-TX and 100BASE-FX ports. Such racks realize centralized management of the media converters, while standardized, for example, by the JIS (Japanese Industrial Standards) and the EIA (Electronic Industries Alliance).

A plurality of media converters having a small number of ports are often used instead of one media converter having many ports for exchange, operation, and wire configuration purposes. For instance, when each media converter is assigned to a different area, an area affected by an exchange of one faulty media converter can be limited to the area assigned to the broken media converter.

Conventional media converter racks typically use a tray, fixed onto a frame, to house several media converters in a row, and the racks eventually demand multistage, stacked trays so as to use a large number of media converters. Therefore, while attaching or exchanging a media converter to a first tray, a second, upper tray, just above the first tray needs to be arduously removed from the frame. A similar problem occurs when a power unit is mounted onto one tray.

In addition, a specific type of small media converter has, for example, a 100BASE-TX port at its front surface, a 100BASE-FX at its back surface, and various operational switches at its top surface. Therefore, in order to manipulate various switches at the top surface of the media converter on the tray, it is necessary to arduously remove the upper tray just above it or inconveniently insert a finger between the top surface of the media converter and the upper tray.

Moreover, where a media converter is mounted on the tray such that the front surface of the media converter faces the tray's front surface, the 100BASE-FX port faces the tray's rear surface. Consequently, it is difficult to remove or route an optical fiber cable connected to the 100BASE-FX port through the tray's front plane, reducing the network wire configuration flexibility. The conventional rack also does not have a structure such that it may easily facilitate attachments, exchanges, operations, and wire configurations of the media converters.

An improved media converter accommodation apparatus would therefore be beneficial.

SUMMARY OF CERTAIN INVENTIVE EMBODIMENTS

An accommodation apparatus, configured to house a plurality of communication devices for connection to transmission media, comprises a support part fixed to an external frame, and a loading part, movable relative to the support part, wherein the loading part has a first surface and a second surface, wherein the loading part is configured to detachably house the plurality of communication devices, and wherein the first surface and the second surface provide the transmission media access to the communication device.

The second surface can be located opposite to the first surface, and the accommodation apparatus may further comprise a restraint part configured to restrict a moving distance of the loading part relative to the support part.

In the accommodation apparatus, the transmission media may comprise first and second transmission media, and the communication device may be a media converter configured to convert a signal for the first transmission medium to a signal for the second transmission medium, wherein the first transmission medium is connected to the media converter through the first surface of the loading part, and wherein the second transmission medium is connected to the media converter through the first and second surfaces of the loading part.

Another aspect of the invention comprises method of installing a media converter in a media converter housing rack, wherein the method comprises slidably removing a rack housing from a bracket housing, wherein the rack housing is not completely removed from the bracket housing. The method further comprises fastening a media converter between a plurality of bridge parts on the rack housing in a first plane of the rack housing, connecting a transmission medium to the media converter, routing the transmission medium from the medium converter in the first plane of the rack housing to a second plane of the rack housing, and connecting a power cable from a power supply to the media converter, wherein the power supply is positioned in the first plane of the rack housing.

In an additional aspect of the invention, an accommodation apparatus configured to detachably house a plurality of communication devices connected to transmission media comprises a first loading part, configured to securely support a power unit, and a second loading part, configured to accommodate the transmission media connected to the communication device, wherein the second loading part is located at an elevation different from that of the first loading part in the accommodation apparatus.

In yet another aspect of the invention, a communication device housing rack comprises a frame, a plurality of brackets, fixed to the frame, and a plurality of racks, configured to be slidably engaged and movable with respect to the plurality of brackets, wherein each rack is configured to house a plurality of communication devices and a power unit on a first plane, and wherein a communication medium connected to at least one of the communication devices is routed to a second plane in the rack, parallel to the first plane.

The racks may comprise a front end plate having a plurality of windows so as to provide access to the communication devices, and a bottom plate having at least one access hole proximal to an area where the communication device is housed so as to allow the transmission media to pass through the access hole.

DETAILED DESCRIPTION OF CERTAIN EMBODIMENTS

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 1:
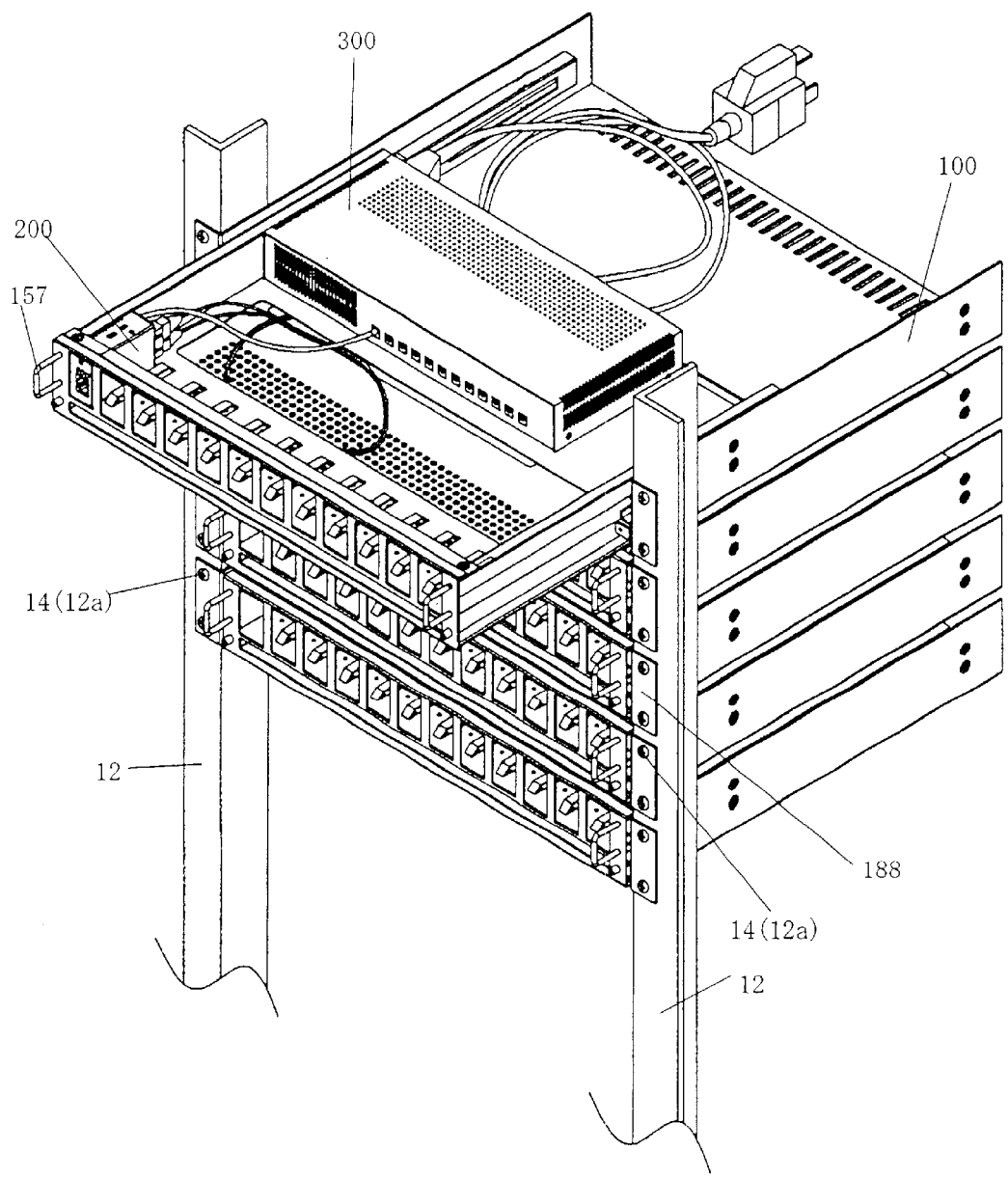
FIG. 1 is an illustration of one embodiment of an accommodation apparatus of the invention.

FIG. 1 is an illustration of one embodiment of an accommodation apparatus 10. The accommodation apparatus (or rack) 10 includes a number of stacked, multistage sub-racks 100, wherein each sub-rack 100 is configured to house a plurality of media converters 200 and a power unit 300. The racks 100 are fixed onto a pair of frames 12 using a pair of fixing parts 188 and screws 14.

In FIG. 1, each frame 12 has an L-shape and a plurality of screw holes 12a for securing the sub-rack 100 to the frame 12. The frame 12 can be made of metal, plastic, wood or other materials so as to support the sub-rack(s) 100.

Figure 2:
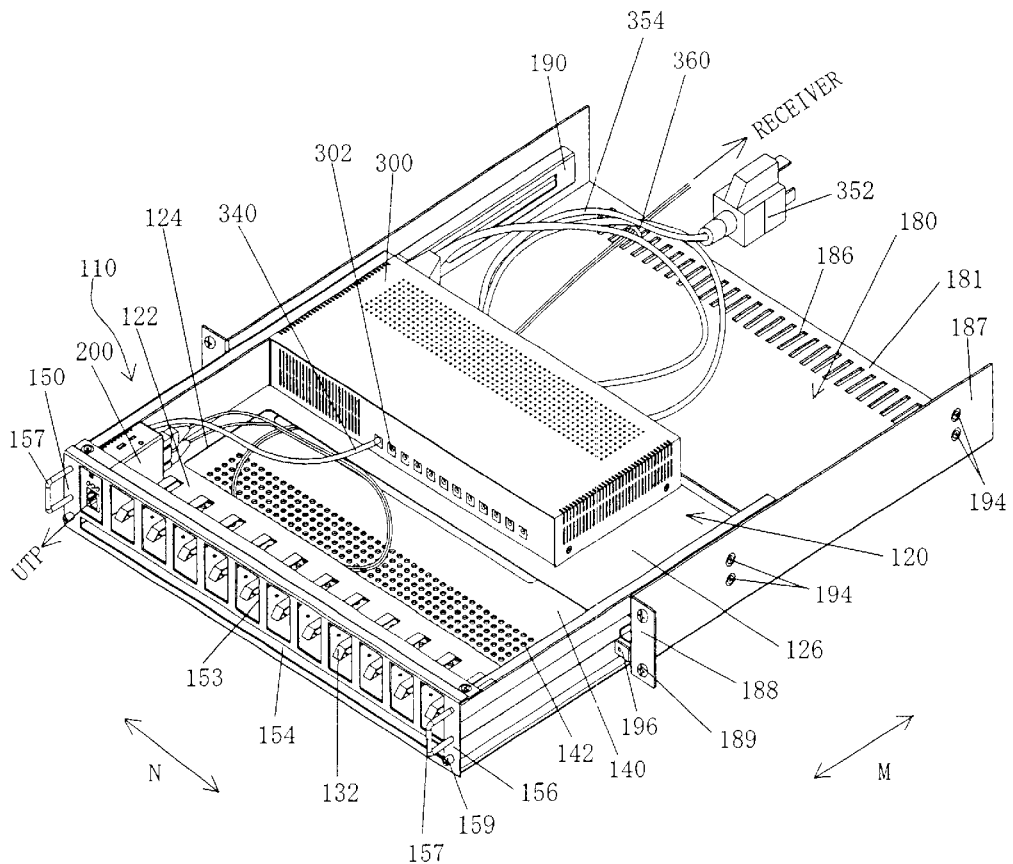
FIG. 2 is an illustration of one embodiment of a sub-rack for use with the accommodation apparatus shown in FIG. 1.

FIG. 2 is an illustration of one embodiment of the sub-rack 100. The sub-rack 100 can be incorporated, for example, into an EIA300D defined 19" rack. The sub-rack 100 removably accommodates a plurality of media converters 200, and facilitates the exchange, operation, and wire arrangement of the media converter(s) 200.

The sub-rack 100 comprises a tray part 110 and a bracket part 180. The tray part 110 is mounted to the bracket part 180 while movable in a direction M relative to the bracket part 180. The tray part 110 includes a set of upper, lower and front plate parts 120, 140, 150.

Figure 3A:
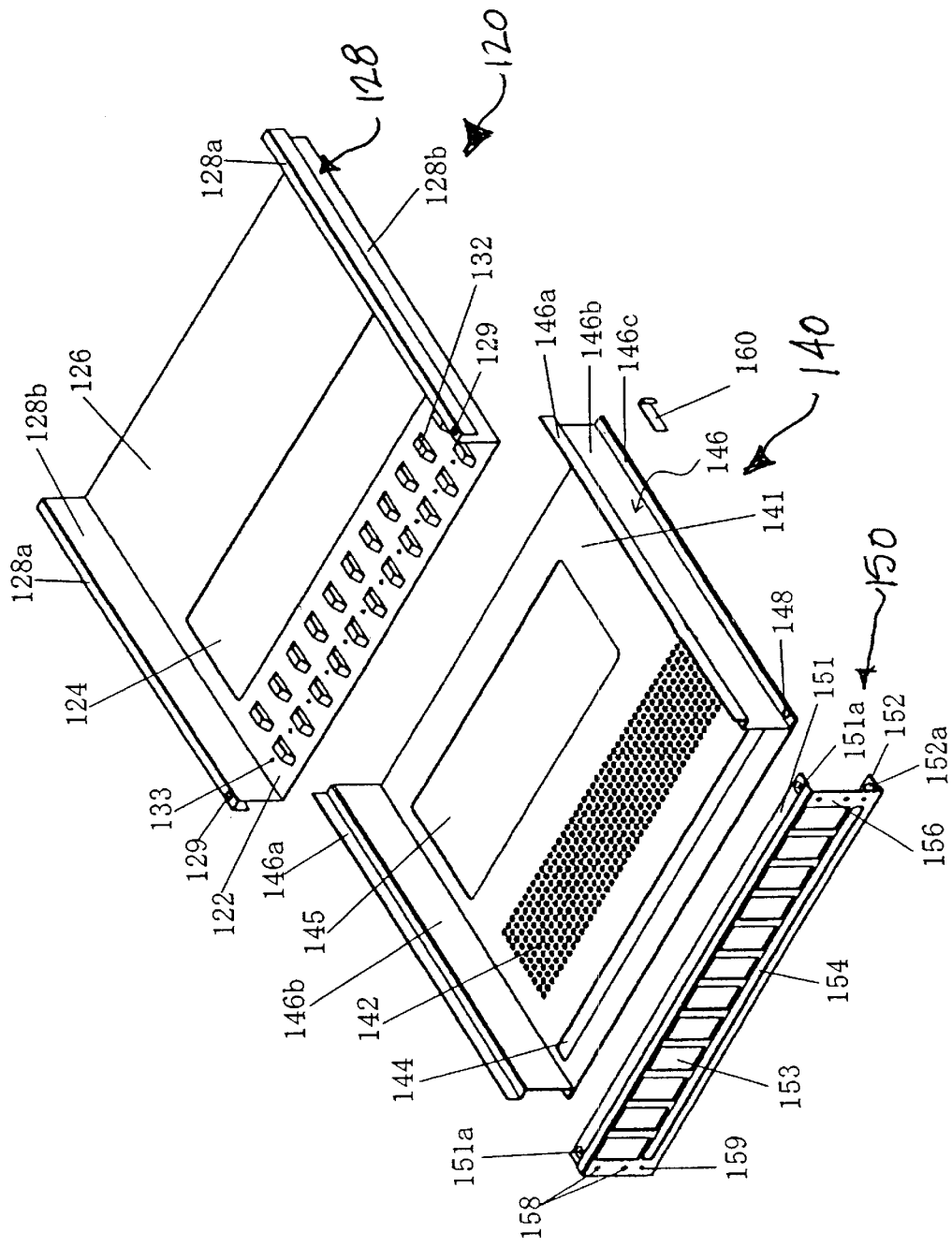
FIG. 3A is an exploded perspective view of one embodiment of a tray part of the sub-rack shown in FIG. 2.
Figure 3B:
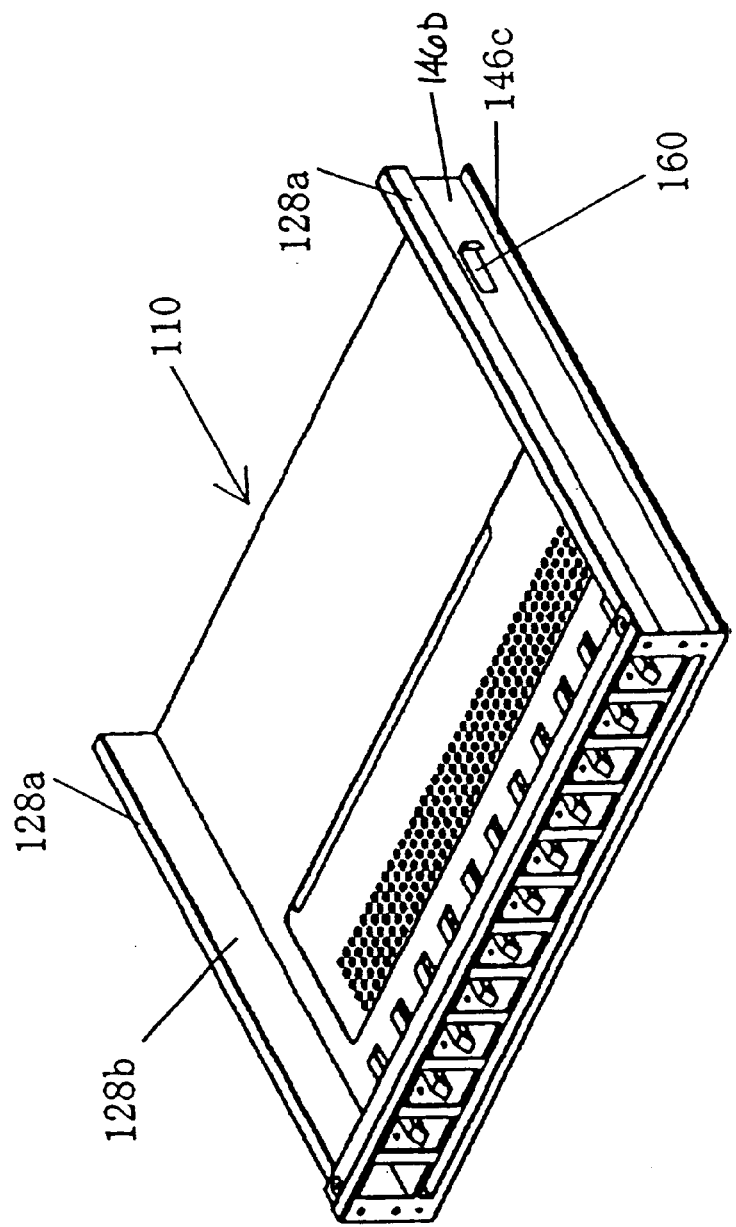
FIG. 3B is a perspective view of the tray part of FIG. 3A after assembly.

FIG. 3A is an exploded perspective view of the tray part 110, and FIG. 3B is a perspective view of the assembled tray part 110. As shown in FIG. 3A, the upper plate part 120 comprises a front part 122, a middle hole 124, a rear part 126, and a pair of side parts 128. Each side part 128 includes a top part 128a, and a middle part 128b. The upper plate part 120 can be formed, for example, by bending a metal plate member in an approximately U shape.

The lower plate part 140 comprises a bottom plate 141 and a pair of side plate parts 146. The lower plate part 140 is formed, for example, by bending one metal plate member, and supports the upper plate part 120 using the side plate parts 146. In one embodiment, each side plate part 146 has an approximately U shape as viewed from the front, and includes a top part 146a, a middle part 146b, and a bottom part 146c. The top part 146a is equipped with an outwardly bent L shape, and engages with the side part 128 of the upper plate part 120.

The middle part 146b is positioned perpendicular from the bottom plate 141 and is affixed with a stopper 160 using a screw hole (not shown) provided at the middle part 146b. The stopper 160 has an L shape, and can prevent not only damage and disconnection of an optical fiber cable and power unit cable connected to the media converter, but also undesired complete removal of the tray 110 from the bracket part 180.

The bottom parts 146c are positioned orthogonal to the middle parts 146b, and fixed onto the front plate part 150 through screw holes 148 aligned with the screw holes 152a.

In one embodiment, the top part 128a of the side part 128 is bent outwardly in a U shape, engaged with the side plate part 146 of the lower plate part 140, and fixed onto the front plate part 150 through the screw holes 129 aligned with the screw holes 151a in the front plate part 150. The middle part 128b of the side part 128 can be formed perpendicular from the upper plate part 120, and have a height of at least the media converters 200 and the power unit 300.

The media converter(s) 200 and power unit 300 (FIG. 1) can be secured within the tray part 110 by overlaying the upper plate part 120 on the lower plate part 140, and by engaging the side part's 128 top part 128a of the upper plate part 120 with the top part 146a of the side part 146 of the lower plate part 140. The upper plate part 120 and the lower plate part 140 are secured by aligning screw holes 129 with screw holes 151a in the front plate part 150 and fastening with screws.

The front part 122 of the upper plate part has bridge parts 132 and screw holes 133, configured to hold and secure the media converter(s) 200 in the tray part 110. In one embodiment, the bridge part 132 has an approximately rectangular parallelepiped shape having a predetermined height, and configured to position each media converter 200, so as to prevent its rotation during use.

Figure 4A:
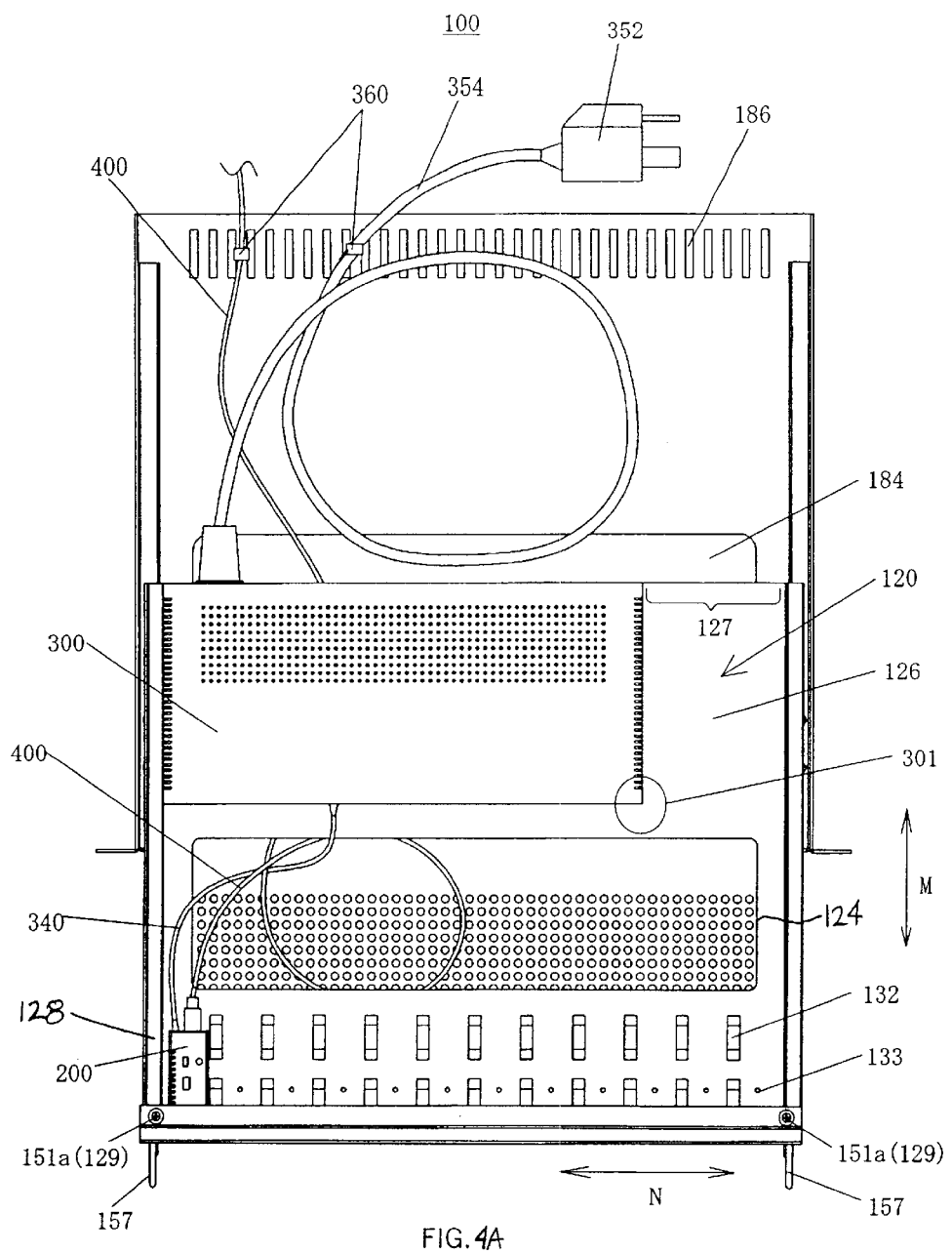
FIG. 4A is a top plan view of the sub-rack shown in FIG. 2.
Figure 4B:
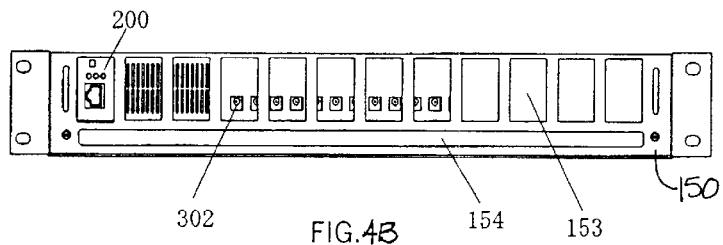
FIG. 4B is a front elevational view of the sub-rack shown in FIG. 2.

FIGS. 4A and 4B, respectively, are top and front views of the sub-rack 100. As can be seen in FIG. 4A, two rows of bridge parts are formed in parallel to each other in the direction M and each row contains eleven bridge parts 132 formed in a direction N, orthogonal to the direction M, such that 22 bridge parts in total are formed in the upper plate part 120. The media converter 200 may be inserted between each pair of adjacent bridge parts 132 in the direction N, and additionally between a pair of bridge parts 132 and the side part 128, as shown in FIG. 4A.

Figure 5A:
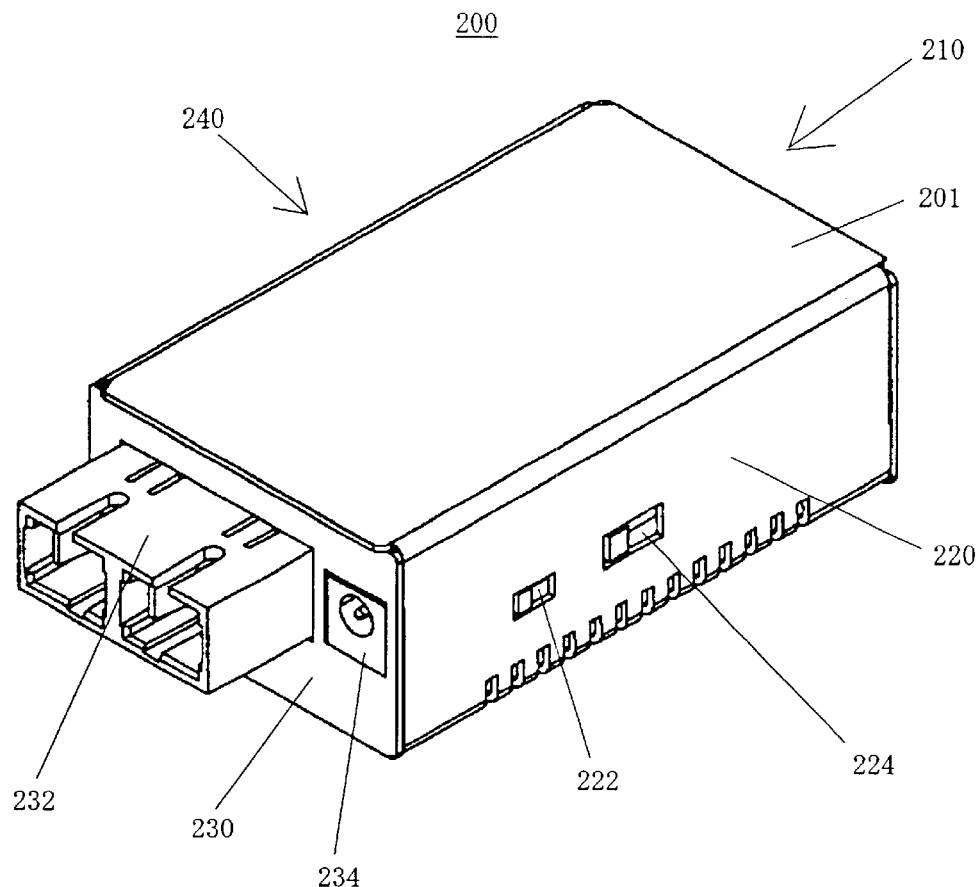
FIG. 5A is a perspective view of a media converter to be housed in the accommodation apparatus shown in FIG. 1.
Figure 5B:
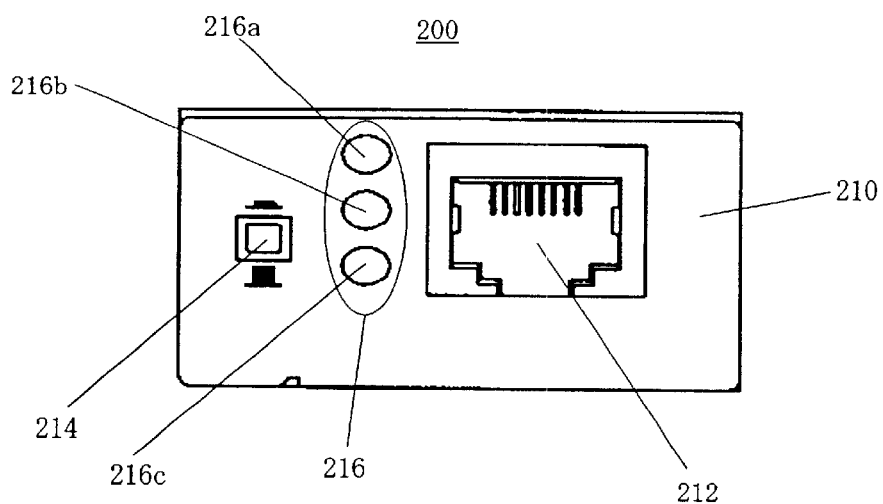
FIG. 5B is a front elevational view of a media converter to be housed in the accommodation apparatus shown in FIG. 1.

FIG. 5A is perspective view of an exemplary media converter 200, and FIG. 5B is a front elevational view of the media converter 200 of FIG. 5A. As previously described, the media converter 200 is configured to convert a signal for propagation in a first transmission medium, such as a UTP cable, to a signal for propagation in a second transmission medium, different from the first transmission medium, such as the optical fiber cable 400. The media converter 200 can be implemented with, for example, the MMC100 Series (including MMC101, MMC102, MMC103, and MMC103LH) media converters produced by Allied Telesis Kabushiki Kaisha.

The media converter 200 comprises a front surface 210, a top surface 220, a rear surface 230, and a bottom surface 240 (as installed and shown in FIG. 1). In one embodiment, the front surface 210 comprises, as shown in FIG. 5A, a 100BASE-TX port 212, a link test switch 214, and three setup-confirming LED lamps 216. The 100BASE-TX port 212 is a connector for connecting to a UTP cable (not shown) that can be connected to an external device, such as a hub in the Ethernet. The 100BASE-TX port 212 can have an automatic recognition function of Full Duplex/Half Duplex, and operate in a mode in accordance with an external device.

The link test switch 214 is a switch to facilitate selection between a normal mode and a test mode, wherein the normal mode indicates connection statuses of two communication devices to be connected to the 100BASE-TX port 212 and the 100BASE-FX port 214, which will be described further below, and the test mode indicates whether a link is established between the port on the converter 200 and a connected device.

The LED lamps 216 can be used to confirm a specific configuration for communication, and include an LED lamp 216a for identifying a link test, an LED lamp 216b for identifying a connection of the 100BASE-FX port 232, and an LED lamp 216c for identifying the 100BASE-TX port 212.

The top surface 220 comprises a communication mode switch 222, and an MDI/MDI-X switch 224. The communication mode switch 222 is a switch for selecting a communication mode (Full Duplex/Half Duplex), so as to select the same communication mode as that of the device connected to the 100BASE-FX port 232. The MDI/MDI-X switch 224 allows selection between the 100BASE-TX port 212 as a cascade connection port and a normal MDI-X port.

The rear surface 230 includes 100BASE-FX port 232, and a DC jack 234. The 100BASE-FX port 232 is a connector to which an optical fiber cable 400 can be connected. The DC jack 234 is a connector to which a DC cable can be connected. The optical fiber cable 400 (FIG. 4A) can be connected, for example, to an optical network.

Each media converter 200 is fixed at the bridge part(s) 132 of the tray 110 by aligning a screw hole (not shown) in a lower surface 240 of the media converter 200 with one of a plurality of screw holes 133 in the upper plate part 120, and fastening with a screw, wherein the screw holes 133 are aligned along the direction N between each pair of bridge parts 132.

The screw hole 133 and the lower surface of the media converter 200, when fastened with a screw, secure the media converter 200 to the sub-rack 100, but require a tool, such as a screwdriver, for its attachment. Accordingly, in an alternative embodiment, a mechanical engagement between the bridge part 132 and the media converter 200 fixes the media converter 200 at the bridge part(s) 132. Such a mechanical engagement may use any of a variety of known techniques.

Figures 6A, 6B:
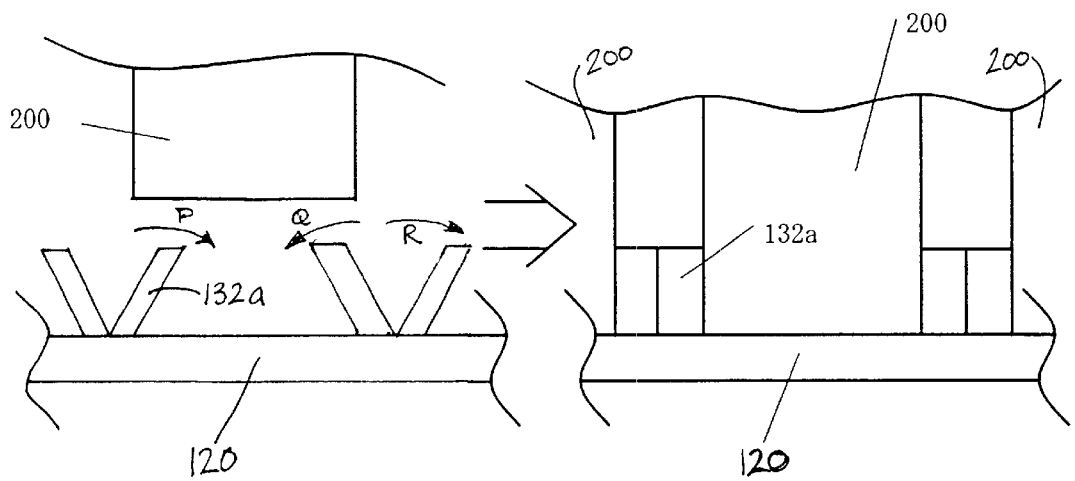
FIG. 6A is a side elevational view illustrating one embodiment of a bridge part for use with the sub-rack shown in FIG. 2 and a portion of a media converter prior to installation with the bridge part.
FIG. 6B is a side elevational view illustrating the converter installed with the bridge part of FIG. 4A.

In one embodiment, the bridge parts 132 may be replaced with bridge parts 132a made of an elastic leaf spring, as shown in FIGS. 6A–B. The elastic force of the spring is applied by the bridge parts 132a in a direction illustrated by arrows P, Q, and R, such that the media converter 200 is fixedly installed in the sub-rack 100 by opening the bridge parts 132a in a reverse direction of the arrows P, Q, and R, and inserting the media converter 200 between two adjacent bridge parts 132a.

Figure 6C:
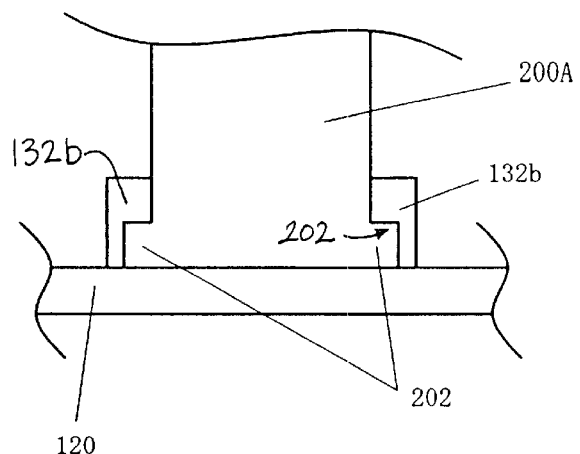
FIG. 6C is a side elevational view illustrating one embodiment of a bridge part and media converter for use with the sub-rack shown in FIG. 2.

In another embodiment, the bridge parts 132 may be replaced with L-shaped bridge parts 132b shown in FIG. 6C, and the media converter 200 may be replaced with a media converter 200A. The bridge part 132b has a reduced lower portion width, proximal to the upper plate part 120, than a width of an upper portion. In addition, the media converter 200A is different from the media converter 200 in that its housing has a wider width proximal to the lower portion 240 of the converter 200 as shown in FIG. 5A, so as to form a shelf 202. The media converter 200A may be fixed at the bridge parts 132b by inserting the wider lower portion of the media converter 200A between the two bridge parts 132b, and engaging the L-shaped portion of the bridge part 132b with the shelf 202 on the converter 200A. Thereby, the converter 200A can be secured in the tray 110.

Referring back to FIGS. 2–3, the front plate part 150 is attached perpendicular to the upper and lower plate parts 120 and 140, and approximately level with the side plates 187 of the bracket part 180, which will be described in further detail herein below. The front plate part 150 has upper and lower parts 151, 152, a plurality of windows 153, a notch 154, and a pair of edges 156.

The upper and lower parts 151, 152 of the front plate part 150 are formed parallel to the upper and lower plate parts 120, 140 by bending a top and a bottom of a single plate into an L shape. The upper part 151 has screw holes 151a so as to secure the front plate part 150 to the upper plate part 120 using screws and screw holes 129 provided in the upper plate part 120. Similarly, the lower part 152 has screw holes 152a to fix the front plate part 150 using screws and screw holes 148 provided in the lower plate part 140.

The front plate part 150, in one embodiment, has twelve rectangular windows 153 corresponding to the front surfaces 210 of the media converters 200, wherein the tray part 110 is configured to house twelve media converters 200. The UTP cable can be connected to the 100BASE-TX port 212 at the front surface 210 of the media converter 200 through the window 153.

In one embodiment, an optical fiber cable 400 is connected to the media converter 200, and extends through a middle hole 124 in the upper plate part 120 of the sub-rack 100, as shown in FIGS. 2, 3A, and 4A. As will be discussed later, the optical fiber cable 400 can be vulnerable to bending and breaking, and thus should advantageously maintain a predetermined radius of curvature. In addition, depending upon the network wire configuration, there may be a need to remove the optical fiber cable 400 via the front or rear plane of the accommodation apparatus 10.

The middle hole 124, in combination with the lower plate part 140, accommodates the optical fiber cable 400 at an elevation different from that of the media converters 200 and power unit 300. Thereby, the media converter 200 and power unit 300 do not block the removal of the optical fiber cable 400 from either the front or rear of the accommodation apparatus 10.

In the event the optical fiber cable 400 and the power unit 300 are located on the same plane, the optical fiber 400 can be removed from the rear plane of the sub-rack 100 through the area 127 shown in FIG. 4A, next to the power unit 300 on the rear part 126. However, an optical fiber 400 connected to the leftmost media converter 200 in FIG. 4A could bend at a corner 301 of the power unit 300 and incur damages. Thus, by routing optical fibers through the middle hole 124, the optical fiber 400 can be removed more safely.

The middle hole 124 may comprise multiple holes (twelve, for example) so as to correspond to the number of media converters 200 housed in the sub-rack 100, however the preferred embodiment illustrates a single large hole so as to route the optical fiber cable 400 into the bottom plate part 140 as well as to maintain the predetermined radius of curvature.

Figure 7A:
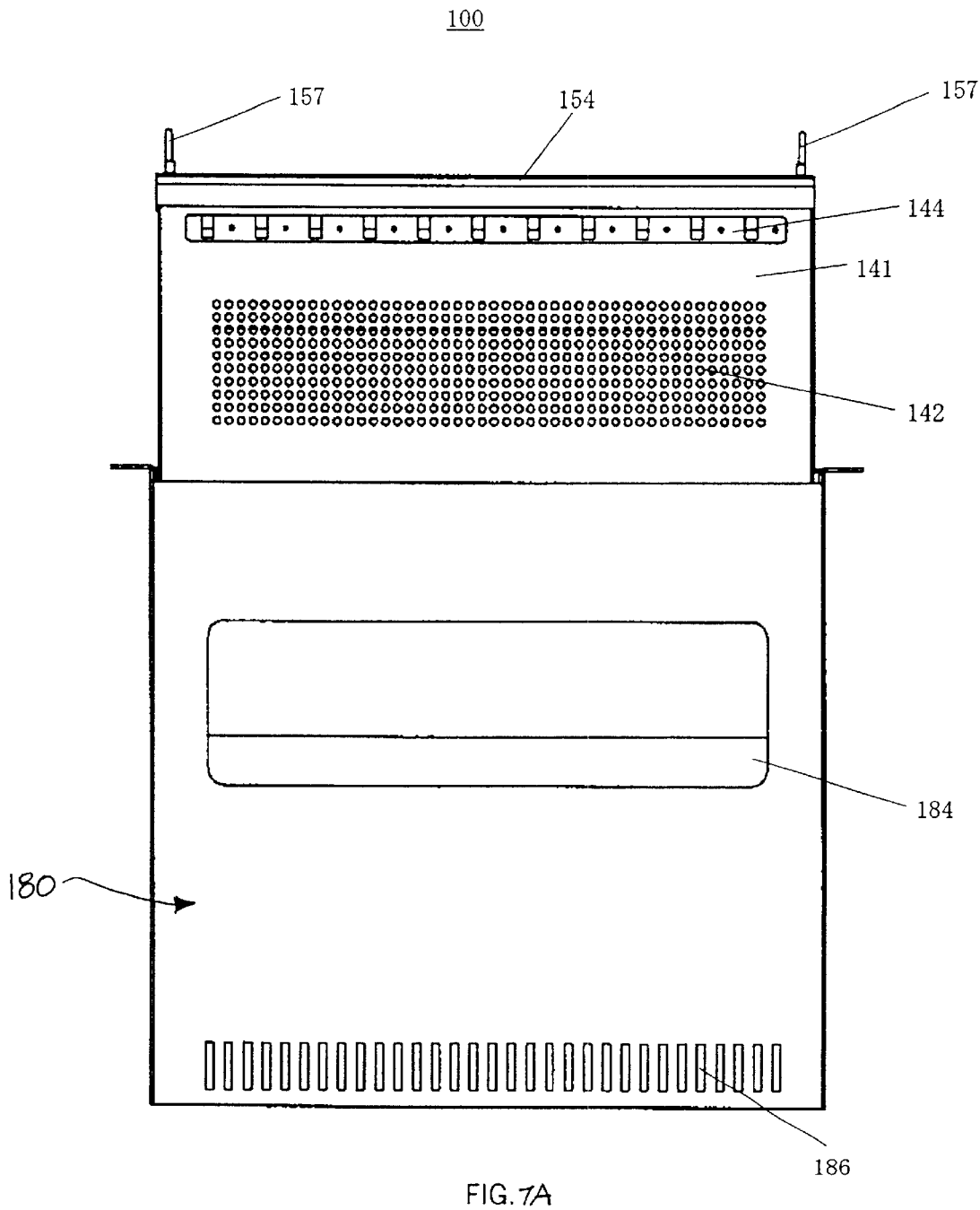
FIG. 7A is a bottom plan view of the sub-rack shown in FIG. 2.

The middle hole 124 is aligned with a number of radiation holes 142 in the tray part 110, and an opening 184 in the bracket part 180 of the sub-rack 100, serving as a radiation vent, as shown in FIG. 7A, where FIG. 7A is a lower view of the sub-rack 100.

In an alternate embodiment, the media converter 200 can be positioned on the top or lower plate part 120, 140, the power unit 300 can be located on the lower plate part 140, and the optical fiber cable 400 can be routed out from the rear plane of the accommodation apparatus 10 via the rear part 126 of the upper plate part 120.

Referring back to FIGS. 3A and 4A, the rear part 126 of the upper plate part 120 is configured to support and secure the power unit 300 in the sub-tray 100. The rear part 126 can be slightly longer than the power unit 300 in the direction M and narrower than the power unit 300 in the direction N. The rear part 126 and the power unit 300 form the area 127 shown in FIG. 4A. In addition, one or more radiation holes may be formed in the rear part 126.

As shown in FIGS. 2–4, the lower plate part 140 of the tray part 110 can accommodate the optical fiber cable 400 connected to the media converter 200 (as shown in FIG. 2), and allows the optical fiber cable 400 to be removed via both the front and rear of the sub-rack 100.

In one embodiment, radiation holes 142, an opening 144, and a cutout portion 145 are formed in the bottom plate 141. The bottom plate 141 can be wide enough so as to accommodate a surplus portion of the optical fiber cable 400.

Figure 7B:
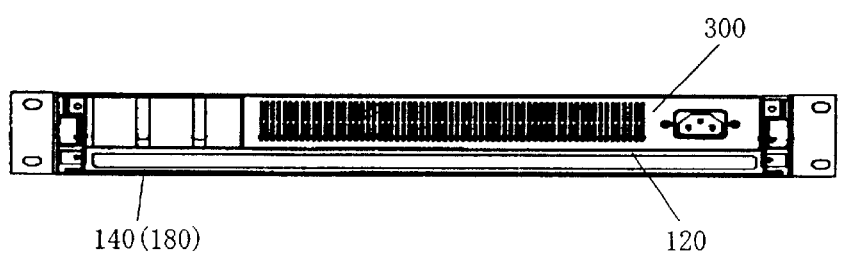
FIG. 7B is a rear elevational view of the sub-rack shown in FIG. 2.

Typically, an industry standard determines the cable length of the optical fiber cable 400, thereby leaving a surplus portion of cable in some cases. The bottom plate 141 in this embodiment can accommodate the surplus portion of the connected optical fiber cable 400, and protect the optical fiber cable 400 from excessive bending and damage. The optical fiber cable 400 accommodated in the bottom plate 141 may be removed via the front plane through a notch 154 in the front plate part 150, or via the rear plane as shown in FIG. 7B.

As illustrated in FIGS. 3A, 3B and 7A, the radiation holes 142 can be a plurality of meshed holes corresponding to the location of the middle hole 124 in the upper plate part 120, so as to allow a vent for heat to radiate away from the media converter(s) 200 and the power unit 300.

The opening 144 is formed, as shown in FIGS. 3A and 7A, such that it allows access to the front part 122 of the upper plate part 120. Each media converter 200 is fastened through its screw hole (not shown) in the bottom surface 240, and the screw hole 133 on the front part 122 via the opening 144.

The cutout portion 145 (FIG. 3A) facilitates fixation of the power unit 300 to the upper side of the rear part 126 of the tray part 110 using screws fastened via the lower side of the tray part 110.

As shown in FIG. 7A, the notch 154 provided in the front plate part 150 extends along a range in which the media converters 200 are mounted. The notch 154 allows the optical fiber cable 400 to be inserted or removed through the front surface of the sub-rack 100, thereby increasing the flexibility of the network wire configuration of the sub-rack 100.

A handle 157 can be attached to each edge 156 of the front plate part 150 using screws fastened to the handle 157 through two screw holes 158. The handle 157 can be formed from, for example, metal or plastic, with an approximately U-shaped grip. The handle can be used to move the tray part 110 relative to the bracket part 180. Movement of the tray part 110 with respect to the bracket part 180 facilitates the exchange, operation and wire configuration of the media converter 200, as will be described in further detail herein below.

As shown in FIG. 2, a screw hole 159 provided in the front plate part 150 facilitates the attachment of the tray part 110 to the bracket part 180 with an extended portion 196 on the bracket part 180, after the tray part 110 is completely installed into the bracket part 180.

The bracket part 180 can be formed by bending a metal plate member into an approximately U shape so as to movably support the tray part 110, and comprises a bottom plate 181 and a pair of side plates 187.

As shown in FIGS. 2 and 7A, the bottom plate 181 includes an opening 184 and a plurality of vents 186. The opening 184 allows radiation, in cooperation with the radiation holes 142 in the lower plate part 140, of heat from the media converter 200 and the power unit 300. In one embodiment, each vent 186 is a slit extending in the direction M, wherein the power cable 354 can be affixed to the bottom plate 181 using a tie 360 extended through adjacent vents 186. In another embodiment, the vents 186 can be large slits so as to allow the power cable 354 to be routed through one of the vents 186. Since the vents 186 extend in the direction M, the power cable 304 is not vulnerable to severing while the tray part 110 moves in the direction M while affixed to the bottom plate 181. Although all the vents 186 are rarely used simultaneously for attachment of power cables 354, a number of pieces can be used to allow the power cable 354 to be attached and removed without applying an excessive force to the power cable 354.

Each side plate 187 stands substantially perpendicular to the bottom plate 181, and comprises the fixing part 188 with two screw holes 189 at its front surface, a rail 190, and the extended portion 196. The fixing part 188 is fixed, as shown in FIG. 1, onto the frame 12 through the screw holes 12a, 189 using the screws 14. In addition, the U-shaped rail 190 and projection 196 are provided at the side facing the tray part 110 of the side plate 187.

Figure 8A:
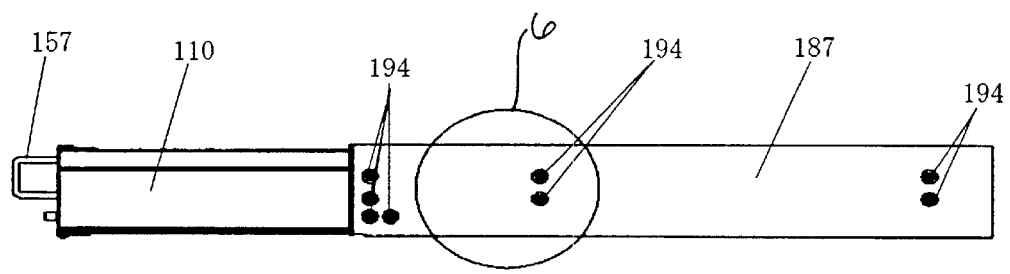
FIG. 8A is a left side elevational view of the sub-rack shown in FIG. 2
Figure 8B:
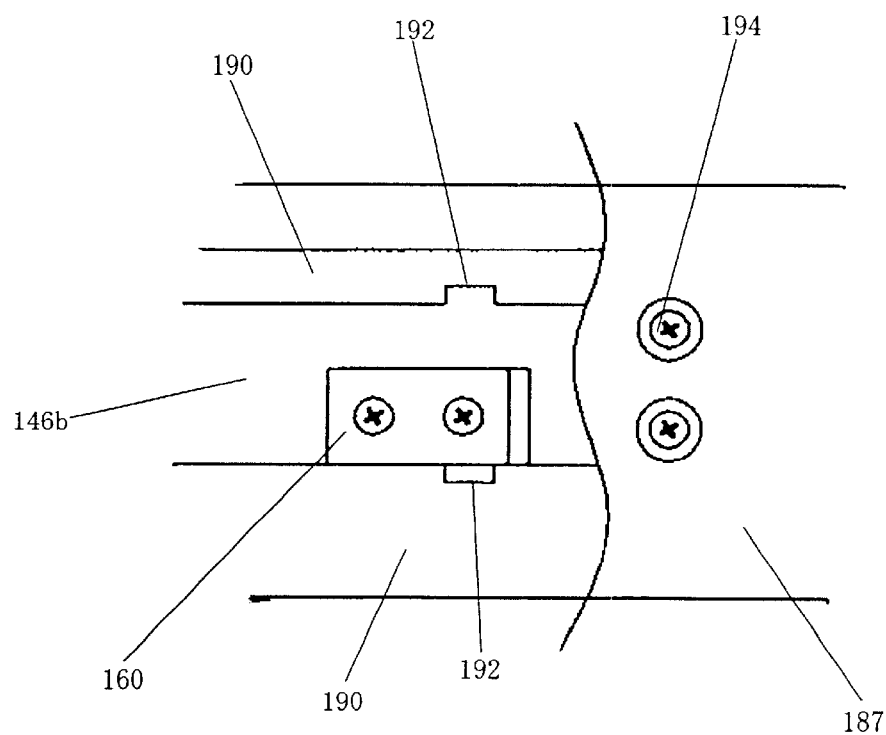
FIG. 8B is an enlarged, cut away view of area 6 of the sub-rack shown in FIG. 6A.

FIG. 8A is a side view of the sub-rack 100 shown in FIG. 2, and FIG. 8B is an enlarged, cut-away view of area 6 of FIG. 8A. As can be seen in FIG. 8B, the rail 190 has two notches 192, wherein engaging the stopper 160 of the tray part 110 with the rail 190 makes the tray part 110 movable relative to the bracket part 180, and wherein removal of the tray part 110 from the bracket part 180 is stopped when the stopper 160 is engaged with the notches 192. Thus, the stopper 160 and the notches 192 prevent the optical fiber cable 400 and the power cable 354 from being severed as well as the tray part 110 from being completely removed from the bracket part 180 due to excessive movement of the tray part 110.

Referring back to FIG. 2, the power unit 300 is fixed to the upper plate part 120, and supplies power for the media converter 200 at twelve DC cable inlets 302 and receives power via one power cable 354. A DC cable 340 is inserted into the DC cable inlet 302, and each media converter 200 is supplied power at the DC jack 234 through the DC cable 340.

A power plug 352 is formed at the end of the power cable 354. The power unit 300 is powered up by inserting the plug 352 into an external, AC electric outlet (not shown). The power unit 300 can include radiation holes at its top, rear, and side surfaces, thereby protecting internal circuits from thermal damages.

The optical fiber cable 400 is a cable for optical communication, and can be made of thin dielectric fiber, such as transparent glass or plastic. The cable 400 typically includes a core having a large refractive index at its center, and a clad, having a small refractive index, surrounds the core. An electrical signal can be converted into an optical signal, which propagates through the core while totally reflected due to the difference of refractive indexes between the core/clad boundaries. The optical fiber cable 400 can have a multimode that allows multiple signal modes to be transmitted due to the difference of refractive indexes between the core/clad boundaries and core's diameter, and a single mode that allows only one mode to be transmitted.

Advantageously, the optical fiber cable 400 has a small attenuation so as to achieve a long-distance transmission without employing an interconnecting device. In addition, because of its thin cable diameter and large transmission rate of 100 Mbps to several Gbps, the optical fiber cable 400 has a larger transmission amount per cable's sectional area than that of a metal cable.

A description will now be given of a method of attachment, exchange, and wire configuration of the media converter 200. In attaching the media converter 200 to the apparatus 10, the sub-rack 100 is drawn from the bracket part 180 and the media converter 200 is mounted on the tray part 110 adjacent to the bridge parts 132 so that the front surface 210 of the media converter 200 faces the window 153, and the top surface 220 faces up. Next, the media converter 200 is fixedly attached by fastening screws from the lower side of the tray part 110 via the opening 144 and through one of the screw holes 133. The fastening step can be omitted when the bridge parts 132a or 132b are used, as shown in FIGS. 6A–6C.

After securing the media converter 200 in the tray 110, a UTP cable is connected to the 100BASE-TX port 212, the DC cable 340 is connected to the DC cable inlet 302 in the power unit 300 and the DC jack 234 in the converter, and the optical fiber cable 400 is connected to the 100BASE-FX port 232. The optical fiber cable 400 may be routed out of the sub-tray 100 via the notch 154 at the front plane or from the rear plane. The reverse procedure is repeated in exchanging the media converter 200.

Thus, when the sub-rack 100 is drawn from the bracket part 180, the media converter 200 can be attached and/or exchanged without removing the upper sub-rack 100. The notches 192 provided at the rail 190 and the stopper 160 provided at the tray part 110 prevent the tray part 110 from being completely removed from the bracket part 180.

Since the optical fiber cable 400 may be routed out of the sub-rack 100 via both the front and rear planes of the sub-rack 100, the optical fiber cable 400 may be connected to a network device at a location near the front side or the rear side of the accommodation apparatus 10. In addition, the bottom plate 141 can accommodate the surplus portion of the optical fiber cable 400, preventing the optical fiber cable 400 from being sharply bent and/or broken.

A description will now be given of an attachment, exchange, and wire configuration of the power unit 300. First, the power unit 300 is secured onto the upper plate part 120 of the tray part 110 via fastening screws or brackets (not shown). Typically, the power unit 300 is attached to the upper plate part 120 before the media converters 200 are attached, and before the upper plate part 120 is attached to the lower plate part 140. However, after the tray part 110 has been assembled, the power unit 300 may be secured via the cutout portion 145 in the bottom plate 141 of the lower plate part 140.

After attaching the power unit 300, the power cable 354 can be routed through one of the vents 186 in an embodiment where a vent 186 is a slit large enough to allow passage of the cable 354. The slit 186 through which the power cable 354 is routed depends upon the positional relationship between the plug 352 and an external, electric outlet. The tie 360 can be connected to the vent 186 in the bracket 180 to affix a surplus portion of the power cable 354 to the bracket part 180.

The reverse procedure is repeated in exchanging the power unit 300. Since each media converter 200 is independently supplied power from the power unit 300, an exchange of one media converter 200 does not affect another media converter 200.

Thus, when the sub-rack 100 is drawn from the bracket part 180, the media converter 200 can be installed and exchanged without removing the upper sub-rack 100. In addition, the tie 360 bunches and fixes the power cable 354, and the vents 186 facilitate the electric connection between the plug 352 and the external, electric outlet. Since the vent 186 extends in the moving direction (i.e., the direction M) of the tray 110, the power cable 354 moves along the slit as the tray part 110 moves, without damage or disconnection.

The following is a description of a communication configuration operation of the media converter 200. After the media converter 200 is attached to the tray part 110, the communication mode switch 222 and the MDI/MDI-X switch 224 are adjusted. The communication mode switch 222 selects the Full Duplex (bi-directional simultaneous communication) or the Half Duplex (one-way directional communications) communication mode. After the UTP cable is connected to the media converter 200, the MDI/MDI-X switch 224 provided at the top surface 210 of the media converter 200 selects and configures a HUB (for use as a cascade connection port with a repeater or switch) or an XPC (for use as a normal 100BASE-TX port). A similar procedure applies to the setup change.

The configuration of the media converter 200 may be confirmed using the link test switch 214 and the LED lamps 216 provided at the front surface 210. Thus, when the sub-rack 100 is drawn from the bracket part 180, the media converter 200 is conveniently operated without removing the upper sub-rack 100.

Thus, according to the present invention, there is provided an accommodation apparatus that facilitates attachments, exchanges, operations, and wire configurations of a communication device, such as a media converter, a power unit, and the like.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. An accommodation apparatus, configured to house a plurality of communication devices for connection to transmission media, the accommodation apparatus comprising:
   a support part fixed to an external frame; and
   a loading part, movable relative to the support part, wherein the loading part has a first surface and a second surface, wherein the loading part is configured to detachably house the plurality of communication devices, and wherein the first surface and the second surface provide the transmission media access to the communication device.

2. The accommodation apparatus of claim 1, wherein the second surface is located opposite to the first surface.

3. The accommodation apparatus of claim 1, further comprising a restraint part configured to restrict a moving distance of the loading part relative to the support part.

4. The accommodation apparatus of claim 1, wherein at least one of the transmission media is an optical fiber cable.

5. The accommodation apparatus of claim 1, wherein the loading part has at least one radiation hole to allow radiation of heat from the communication devices.

6. The accommodation apparatus of claim 1, wherein the transmission media comprise first and second transmission media, and the communication device is a media converter configured to convert a signal for the first transmission medium to a signal for the second transmission medium, and wherein the first transmission medium is connected to the media converter through the first surface of the loading part, and wherein the second transmission medium is connected to the media converter through the first and second surfaces of the loading part.

7. The accommodation apparatus of claim 1, wherein said accommodation apparatus fixes a plurality of the support parts onto the external frame in a direction approximately perpendicular to a moving direction of said loading part.

8. The accommodation apparatus of claim 7, wherein the communication device comprises an operational switch that is exposed from the support part as the loading part is moved.

9. The accommodation apparatus of claim 1, wherein the loading part has a handle to move the loading part relative to the support part.

10. The accommodation apparatus of claim 1, wherein the communication device has a housing, and wherein the loading part includes an engagement part that may be engaged with the housing of the communication device so as to detachably house the communication device in the loading part.

11. An accommodation apparatus configured to detachably house a plurality of communication devices connected to transmission media, the accommodation apparatus comprising:
   a first loading part, configured to securely support a power unit; and
   a second loading part, configured to accommodate the transmission media connected to the communication device, wherein the second loading part is located at an elevation different from that of the first loading part in the accommodation apparatus.

12. The accommodation apparatus of claim 11, wherein at least one of the transmission media is an optical fiber cable.

13. The accommodation apparatus of claim 11, further comprising a support part fixed to an external frame, wherein the first and second loading parts are movable relative to said support part.

14. The accommodation apparatus of claim 13, wherein the support part has one or more slits for guiding a power cable, wherein the power cable connects the power unit to an external power supply, and wherein the slit extends in a moving direction of the first loading part.

15. The accommodation apparatus of claim 11, wherein the second loading part includes at least one radiation hole.

16. The accommodation apparatus of claim 15, wherein the first loading part is configured to house the plurality of communication devices, wherein the first loading part has an opening so as to allow the transmission media to be routed to the second loading part, and wherein the radiation hole is located proximal to the opening.

17. The accommodation apparatus of claim 11, wherein the second loading part includes a first surface and a second surface, and wherein the transmission media can be routed to the communication device through the first and second surfaces of the second loading part.

18. The accommodation apparatus of claim 17, wherein the second loading part includes a front plate part with an opening through which the transmission medium is connected to the communication device through the first surface.

19. The accommodation apparatus of claim 11, wherein the first loading part includes a bridge part that holds the communication device by a mechanical engagement.

20. A communication device housing rack, comprising:
   a frame;
   a plurality of brackets, fixed to the frame; and
   a plurality of racks, configured to be slidably engaged and movable with respect to the plurality of brackets, wherein each rack is configured to house a plurality of communication devices and a power unit on a first plane, and wherein a communication medium connected to at least one of the communication devices is routed to a second plane in the rack, parallel to the first plane.

21. The housing rack of claim 20, wherein at least one of the racks comprises a front end plate having a plurality of windows so as to provide access to the communication devices.

22. The housing rack of claim 20, wherein at least one rack comprises a bottom plate having at least one access hole proximal to an area where the communication device is housed so as to allow the transmission media to pass through the access hole.

23. The housing rack of claim 20, wherein the communication devices are secured on the racks with a mechanical attaching means.

24. A method of installing a media converter in a media converter housing rack, comprising:

slidably removing a rack housing from a bracket housing, wherein the rack housing is not completely removed from the bracket housing;

fastening a media converter between a plurality of bridge parts on the rack housing in a first plane of the rack housing;

connecting a transmission medium to the media converter;

routing the transmission medium from the medium converter in the first plane of the rack housing to a second plane of the rack housing; and connecting a power cable from a power supply to the media converter, wherein the power supply is positioned in the first plane of the rack housing.

* * * * *